(12) United States Patent
Lu et al.

(10) Patent No.: US 10,778,114 B2
(45) Date of Patent: Sep. 15, 2020

(54) ENHANCED PERFORMANCE HYBRID THREE-LEVEL INVERTER/RECTIFIER (71) Applicant: GaN Systems Inc., Ottawa (CA)

(72) Inventors: Juncheng Lu, Kanata (CA); Di Chen, Ottawa (CA); Larry Spaziani, Chelmsford, MA (US)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 16/251,696

(22) Filed: Jan. 18, 2019

(65) Prior Publication Data
US 2019/0238062 A1 Aug. 1, 2019

Related U.S. Application Data (60) Provisional application No. 62/624,285, filed on Jan. 31, 2018.

(51) Int. Cl.
H02M 7/487 (2007.01)
H02M 7/537 (2006.01)
(Continued)

(52) U.S. Cl.
CPC ........ H02M 7/487 (2013.01); H01L 29/7393 (2013.01); H02M 7/537 (2013.01);
(Continued)

(58) Field of Classification Search
CPC ................ H02M 7/487; H02M 7/537; H02M 2001/0054; H03K 17/04123;
(Continued)

(56) References Cited

U.S. PATENT DOCUMENTS 8,300,443 B2 * 10/2012 Takizawa .............. H02M 7/487
363/132
9,036,388 B2 * 5/2015 Komatsu ............... H02M 7/487
363/131
(Continued)

FOREIGN PATENT DOCUMENTS

JP 2011078296 A 4/2011

OTHER PUBLICATIONS

M. Schweizer et al., "Design and Implementation of a Highly Efficient Three-Level T-type Converter for Low-Voltage Applications", IEEE Transactions on Power Electronics, vol. 28, No. 2, Feb. 2013; pp. 899-907.
(Continued)

Primary Examiner — Emily P Pham
(74) Attorney, Agent, or Firm — Miltons IP/p.i.

(57) ABSTRACT

A 3-level T-type neutral point clamped (NPC) inverter/rectifier is disclosed in which neutral point clamping is dynamically enabled/disabled responsive to load, e.g. enabled at low load for operation in a first mode as a 3-level inverter/rectifier and disabled at high/peak load for operation in a second mode as a 2-level inverter/rectifier. When the neutral clamping leg is enabled only under low load and low current, middle switches S2 and S3 can be smaller, lower cost devices with a lower current rating. Si, SiC, GaN and hybrid implementations provide options to optimize efficiency for specific load ratios and applications. For reduced switching losses and enhanced performance of inverters based on Si-IGBT power switches, a hybrid implementation of the dual-mode T-type NPC inverter is proposed, wherein switches S1 and S4 comprise Si-IGBTs and switches S2 and S3 of the neutral clamping leg comprise GaN HEMTs. Applications include electric vehicle traction inverters.

14 Claims, 11 Drawing Sheets (51) Int. Cl.
  H03K 17/0412    (2006.01)
  H01L 29/739     (2006.01)
  H03K 17/284     (2006.01)
  H03K 17/60      (2006.01)
  H03K 17/687     (2006.01)
  H03K 17/12      (2006.01)
  H02M 1/00       (2006.01)

(52) U.S. Cl.
  CPC ..... *H03K 17/04123* (2013.01); *H03K 17/122* (2013.01); *H03K 17/284* (2013.01); *H03K 17/602* (2013.01); *H03K 17/6872* (2013.01); *H02M 2001/0054* (2013.01)

(58) Field of Classification Search
  CPC .. H03K 17/122; H03K 17/284; H03K 17/602; H03K 17/6872; H01L 29/7393
  See application file for complete search history.

(56) References Cited

U.S. PATENT DOCUMENTS

| | | | |
|---|---|---|---|
| 9,344,005 B2* | 5/2016 | Ho | H02M 7/493 |
| 9,735,771 B1 | 8/2017 | Lu et al. | |
| 2012/0218025 A1 | 8/2012 | Honea et al. | |
| 2012/0326646 A1 | 12/2012 | Tanaka et al. | |
| 2014/0252410 A1* | 9/2014 | Laschek-Enders | H01L 29/7393 257/141 |
| 2015/0108958 A1 | 4/2015 | Xu et al. | |

OTHER PUBLICATIONS

H. Kurumatani et al., "GaN-HEMT-Based Three Level T-type NPC Inverter Using Reverse-Conducting Mode in Rectifying", IEEE 26th International Symposium on Industrial Electronics (ISIE), Edinburgh UK Jun. 19-21, 2017 (DOI10.1109/ISIE.2017.8001548); pp. 1941-1946.

R. Chen et al., "Design and Implementation of a Three-Phase Active T-Type NPC Inverter for Low-Voltage Microgrids", Energy and Power Engineering, 2017, 9, pp. 70-77, Apr. 6, 2017 (DOI 10.4236/epe.2017.94B009).

E. Avci et al., "Analysis and design of a grid-connected 3-phase 3-level AT-NPC inverter for low-voltage applications" Turk. J. Elec. Eng. & Comp. Sci. (2017) 25: 2464-2478 (doi:10.3906/3lk-1603-159), v.29 May 2017.

A. Anthon et al., "The Benefits of SiC MOSFETs in a T-Type Inverter for Grid-Tie Applications", IEEE Transaction on power electronics, vol. 32, No. 4, Apr. 2017 (doi: 10.1109/TPEL.2016.2582344) v. 20 Jan. 2017; pp. 2808-2821.

P. Kierstead, "Inverter design optimized using all-SiC power devices", www.electronics products.com, Jan. 30, 2013; 8 pages.

STMicroelectronics presentation APEC 2017 "Power electronics for Electric Vehicles"; 37 pages.

R. Allan, "SiC and GaN vs. IGBTs", Power Electronics, Jul. 27, 2017; 8 pages.

M. Ferdowsi et al., "Gallium Nitride (GaN) based High Frequency Inverter for Energy Storage Applications", EESAT 2017 Conf. Proceedings, Oct. 11, 2017; 18 pages.

Semikron International GmbH Application note AN-11001, "3L NPC and TNPC Topology", Oct. 12, 2015 (www.semikron.com); 12 pages.

M. Ikonen, et al., "Two-Level and Three-Level Converter Comparison in Wind Power Application" (2005); 11 pages.

B. Wang, "Four-Level Neutral Point Clamped Converter with Reduced Switch Count", IEEE Power Electronics Specialists Conference (PESC) 2008. (DOI: 10.1109/PESC.2008.4592337); pp. 2626-2632.

GaN Systems Inc., "Gallium Nitride Power Transistors in the EV World", Presentation dated Jun. 2017; 26 pages.

English abstract and Espacenet machine translation of JP2011078296A Apr. 14, 2011 (listed above); 24 pages.

Juncheng Lu et al., "A GaN/Si Hybrid T-Type Three-Level Configuration for Electric Vehicle Traction Inverter" Oct. 2018 IEEE 6th Workshop on Wide Bandgap Power Devices and Applications (WiPDA)(DOI: 10.1109/WiPDA.2018.8569194); pp. 77-81.

* cited by examiner 3-phase 2-level inverter

Fig. 1
(Prior Art)

3-phase 3-level T-Type NPC inverter

Mode 1: 3-Level phase leg operation

| Phase Current | Initial Vector | Final Vector | Con Loss Distribution | SW Loss Distribution | Conditions |
|---|---|---|---|---|---|
| + | P | 0 | $S_1$ and $S_2$, $S_3$ | $E_{off}(S_1)$ | Inverter(Active) |
| + | 0 | P | $S_1$ and $S_2$, $S_3$ | $E_{on}(S_1)$ | Inverter(Active) |
| - | P | 0 | $S_1$ and $S_2$, $S_3$ | $E_{on}(S_2)$ | Inverter(reactive), Regeneration |
| - | 0 | P | $S_1$ and $S_2$, $S_3$ | $E_{off}(S_2)$ | Inverter(reactive), Regeneration |
| - | N | 0 | $S_4$ and $S_2$, $S_3$ | $E_{off}(S_4)$ | Inverter(Active) |
| - | 0 | N | $S_4$ and $S_2$, $S_3$ | $E_{on}(S_4)$ | Inverter(Active) |
| + | N | 0 | $S_4$ and $S_2$, $S_3$ | $E_{on}(S_3)$ | Inverter(reactive), Regeneration |
| + | 0 | N | $S_4$ and $S_2$, $S_3$ | $E_{off}(S_3)$ | Inverter(reactive), Regeneration |

Mode 2: 2-Level phase leg operation

| Phase Current | Initial Vector | Final Vector | Con Loss Distribution | SW Loss Distribution | Conditions |
|---|---|---|---|---|---|
| + | P | N | $S_1$ and $S_2$ | $E_{off}(S_1)$ | Inverter(Active) |
| + | N | P | $S_1$ and $S_2$ | $E_{on}(S_1)$ | Inverter(Active) |
| - | P | N | $S_1$ and $S_2$ | $E_{on}(S_2)$ | Inverter(reactive), Regeneration |
| - | N | P | $S_1$ and $S_2$ | $E_{off}(S_2)$ | Inverter(reactive), Regeneration |

Fig. 10
The switching on energy @$V_{BUS}$=800V

Fig. 11
The switching off energy @$V_{BUS}$=800V

Fig. 12

Voltage drop vs. conducting current

Fig. 13

Example 1: EV Traction Inverter/Rectifier

System Efficiency Analysis
(50kW/phase, 800V/400VAC, 10kHz)

- Energy consumption over a discharge/regen cycle
  - Percentage of time for each driving condition

| Modes | City | Highway | Top speed | Accelerating | Regeneration |
|---|---|---|---|---|---|
| Percentage of time | 45% | 40% | 10% | 5% | Braking |
| Load | 10% | 20% | 7% | 100% | 30% |

Table I

- Weighted average of energy consumption (power loss) across discharge/regen cycle

| Device Type | Weighted average loss of Leg [w] | Improvement over IGBT | Cost (USD/leg) |
|---|---|---|---|
| IGBT | 125 / 199 (Regen) | - | 100 |
| SiC | 40 / 50 (Regen) | 67% / 75%(Regen) | 350 |
| Hybrid (GaN/IGBT) | 51 / 46 (Regen) | 59% / 77%(Regen) | 120 |

Table II

| Driving mode | City | Highway | Top speed | Accelerating | Regeneration |
|---|---|---|---|---|---|
| Percentage of time | 45% | 40% | 10% | 5% | Braking |
| Load | 10% | 20% | 7% | 100% | 30% |
| Inverter mode | 3-level with NPC | 3-level with NPC | 3-level with NPC | 2-level | 3-level with NPC |

Fig. 16

ENHANCED PERFORMANCE HYBRID THREE-LEVEL INVERTER/RECTIFIER

CROSS-REFERENCE TO RELATED APPLICATION(S)

This application claims priority from U.S. provisional patent application No. 62/624,285 entitled "Enhanced Performance Hybrid Three-Level Inverter/Rectifier" filed Jan. 31, 2018, which is incorporated herein by reference in its entirety.

TECHNICAL FIELD

This invention relates to three-level Neutral Point Clamped (NPC) inverters/rectifiers, with particular application to performance enhancement of inverters/rectifiers for power applications, such as electric vehicle traction inverters.

BACKGROUND

Figure 1:
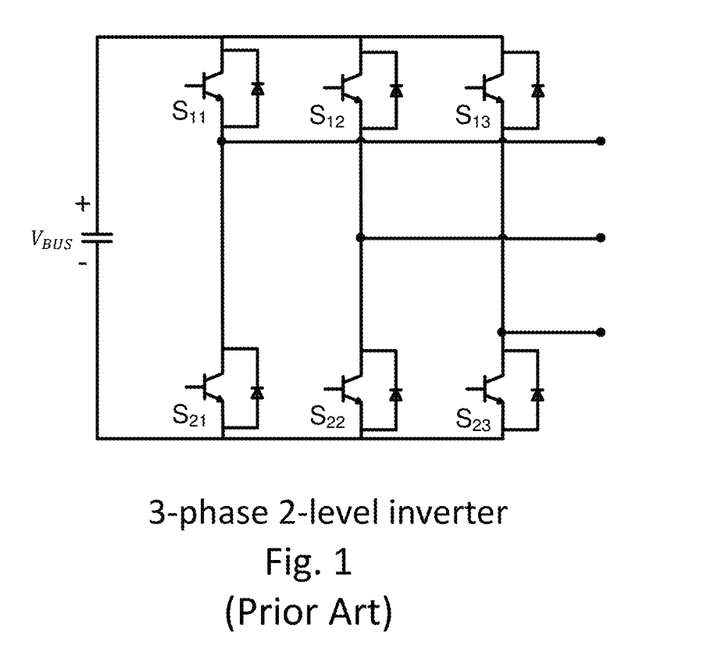
FIG. 1 (Prior Art) shows a circuit schematic for a 2-level inverter topology (three phase) comprising Si IGBTs and anti-parallel diodes.

A two-level inverter topology, as illustrated in FIG. 1, is commonly implemented using either all silicon (Si) technology or all silicon carbide (SiC) technology. That is, the switching transistors are implemented in Si technology using Si IGBTs (Insulated Gate Bipolar Transistors) with Si anti-parallel diodes. Alternatively, the switching transistors are SiC MOSFETS (Metal Oxide Semiconductor Field Effect Transistors) and the anti-parallel diodes are SiC Schottky diodes. Currently, the two-level inverter topology based on Si IGBTs and Si diodes is widely used and remains an established industry standard solution for automotive applications, such as vehicle traction inverters for electric vehicles (EV) and hybrid electric vehicles (HEV). Other applications include, for example, photovoltaic grid inverters, and PFC (Power Factor Correction) rectifiers, motor controllers, and power supplies. Si IGBTs can block high voltages, have low on-state conduction losses, and well-controlled switching times. A two-level converter based on Si IGBTs provides low conduction losses, a small part count and simple operation, at low cost. Thus, there are continued efforts to provide improved performance of lower cost, two-level inverters using Si IGBTs.

SiC MOSFETS and diodes offer performance advantages for the two-level inverter topology, but at significantly higher cost. For example, an article by P. Kierstead, entitled "Inverter design optimized using all-SiC power devices", 30 Jan. 2013, (www.electronicsprodurts.com) provides a comparison of two-level inverter designs using SiC power devices and Si IGBTs. A presentation entitled "Power Electronics for Electric Vehicles", STMicroelectronics, APEC 2017, provides a comparison of Si versus SiC technologies for a two-level converter topology, e.g., a 80 kW EV traction inverter.

Figure 2:
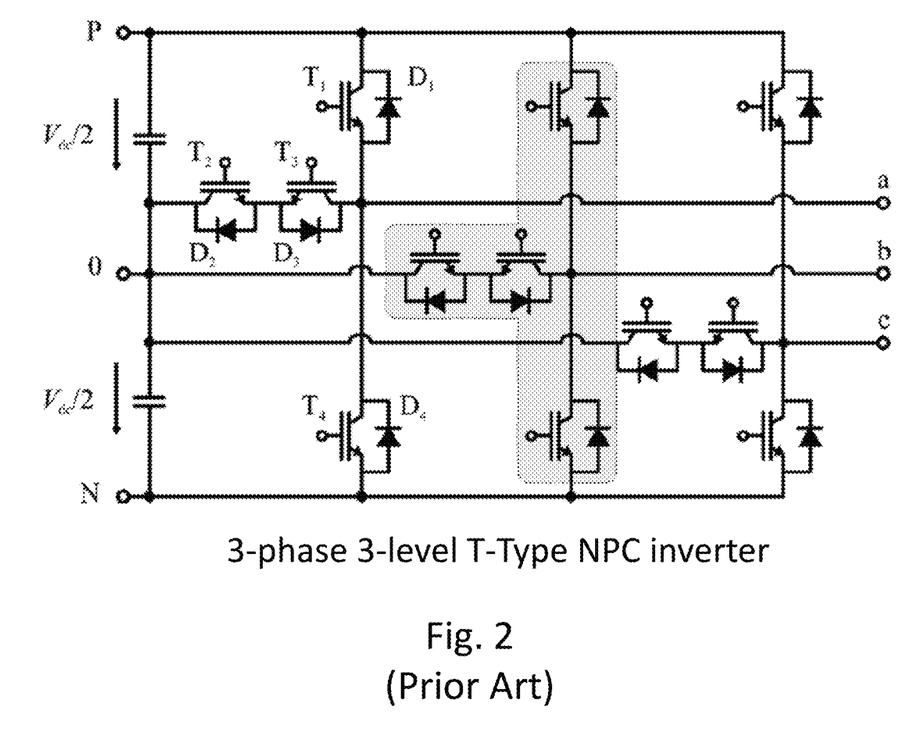
FIG. 2 (Prior Art) shows a circuit schematic for a 3-level T-type Neutral Point Clamped (NPC) inverter topology (three phase) comprising Si IGBTs and anti-parallel diodes.

An example of a three-level T-type Neutral Point Clamped (NPC) inverter topology is shown in FIG. 2. The conventional two-level topology is extended with a neutral clamping leg comprising an active, bidirectional switch to the DC-midpoint. The operation of a three-level T-type Neutral Point Clamped (NPC) converter of this topology, based on Si IGBT components is described in detail in an article by M. Schweizer et al., entitled "Design and Implementation of a Highly Efficient Three-Level T-type Converter for Low-Voltage Applications", IEEE Transactions on Power Electronics, Vol. 28, No. 2, February 2013. This 3-level T-type NPC inverter topology is reported to provide reduced switching losses and superior output voltage quality relative to a conventional 2-level inverter topology.

An article by E. Avci et al., entitled "Analysis and design of a grid-connected 3-phase 3-level AT-NPC inverter for low voltage applications" Turk. J. Elec. Eng. & Comp. Sci. (2017) 25: 2464-2478 (doi:10.3906/31k-1603-159), v. 29 May 2017, discloses an all silicon solution using Si IGBTs for a T-Type 3-level NPC inverter in which the middle bidirectional switch of the neutral clamping leg uses Reverse Blocking IGBTs (RB-IGBTs) that provide both forward and reverse blocking capabilities, which are reported to be more efficient because switching and conduction losses are reduced.

Application note AN-11001, entitled "3L NPC and TNPC Topology", SEMIKRON International GmbH, 12 Oct. 2015 (www.semikron.com), provides a detailed review of the operation of 3-level diode clamped NPC inverter topologies and 3-level T-type NPC inverter topologies implemented with all Si IGBTs and anti-parallel FWDs, for applications in the range of 800V to 1500V, and from 5 kW to 250 kW.

An article by M. Ikonen, et al., entitled "Two-Level and Three-Level Converter Comparison in Wind Power Application" (2005) provides an analysis of power losses in a 2-level topology and 3-level diode clamped topology, 3-level flying capacitor inverter topology, and cascaded H-bridge inverter topology, using Si IGBT technology.

Wide bandgap (WBG) semiconductor technologies, such as SiC and GaN technologies offer performance advantages, such as, higher efficiency, higher switching frequencies, and reduced losses. An article by R. Allan, entitled "SiC and GaN vs. IGBTs: The Imminent Tug of War for Supremacy" in Power Electronics, 27 Jul. 2017, provides a brief overview of the benefits of GaN HEMTs and SiC MOSFETs vs. Si IGBTs. With respect to EV and HEV traction inverters, a presentation entitled "Gallium Nitride Power Transistors in the EV World," GaN Systems Inc., June 2017, discloses an example of a 48V 12 kW 2-level HEV traction inverter using GaN HEMTs, which provides improved efficiency, reduced losses, and higher power density, in an air-cooled module which is one fifth the size and one third the weight of a comparable Si MOSFET inverter. On the other hand, use of Si IGBT technology for power applications is well-established and offers reliable performance at low cost. Also, the latter presentation notes that power applications span a wide range of voltages from low voltage, e.g. 100V to 300V for consumer electronics and power supplies; medium voltage, e.g. 650V to 1200V for applications such as EV/HEV traction inverters, PV inverters, motor controllers and UPS; and high voltage above 1700V, for applications such as smart power grid, wind power generation, and large-scale transport, e.g. rail and shipping. Thus, it is likely that each of Si, SiC and GaN technologies will continue to co-exist and offer complementary solutions for different automotive, industrial, consumer and other power applications.

For further background information on implementation of 3-level T-type NPC inverter topologies using all SiC technology and using all GaN technology, reference is made, by way of example, to the following recently published articles.

An article by A. Anthon et al., entitled "The Benefits of SiC MOSFETs in a T-Type Inverter for Grid-Tie Applications", IEEE Transaction on Power Electronics, Vol 32, No. 4, April 2017 (doi: 10.1109/TPEL.2016.2582344) v. 20 Jan. 2017, provides a comparison of all Si and all SiC implementations of T-Type NPC 3-level inverters.

An article by H. Kurumatani et al., entitled "GaN-HEMT-Based Three Level T-type NPC Inverter Using Reverse-Conducting Mode in Rectifying" presents an all GaN solution for a 3-level T-type NPC Inverter using 100V/4 A GaN HEMTs for low voltage applications;

An article by R. Chen et al., entitled "Design and Implementation of a Three-Phase Active T-Type NPC Inverter for Low Voltage Microgrids", Energy and Power Engineering, 2017, 9, pp 70-77, Apr. 6, 2017 (DOI 10.4236/epe.2017.94B009) discloses an all GaN solution using GaN HEMTs for 3 kW three-phase inverter for low-voltage micro-grids, operable over switching frequencies from 3 kHz to 60 kHz.

Another all GaN implementation is disclosed by M. Ferdowsi et al., in a presentation entitled "Gallium Nitride (GaN) based High Frequency Inverter for Energy Storage Applications", EESAT 2017 Conf. Proceedings, 11 Oct. 2017. This all GaN solution uses 650V GaN HEMTs in an alternative active-clamped 3-level NPC inverter topology.

A few hybrid implementations of 3-level T-type NPC converters have been proposed. For example, Japanese patent publication no. JP2011078296 A, 14 Apr. 2011, entitled "Power Conversion Circuit", by Azuma Satoshi discloses a hybrid implementation of a 3-level T-type NPC power converter topology using Si IGBTs and anti-parallel diodes for all switches, wherein the Si anti-parallel diodes of the neutral clamping leg are replaced with wide bandgap (WBG) diodes. United States patent no. US2015/0108958 23 Apr. 2015, J. Xu et al., entitled, "Hybrid Three-level T-type Converter for Power Applications" discloses a hybrid implementation wherein the outer switching transistors are wide bandgap transistors, e.g. SiC JFETs or SiC MOSFETs, and the transistors of the neutral clamping leg are Si MOSFETS or GaN HEMTs. The article by Anthon et al., referenced above, proposes a hybrid 3-level T-type NPC inverter topology wherein the outer switching transistors are SiC MOSFETS, and switches of the neutral clamping leg are Si IGBTs with anti-parallel diodes.

In view of the reliability and relatively low cost of Si IGBTs and diodes, and their widespread and established use for power applications, there is an ongoing demand for Si IGBT based inverters and rectifiers with enhanced performance for applications, such as, EV and HEV traction inverters, photovoltaic grid inverters and motor controllers.

SUMMARY OF INVENTION

The present invention seeks to provide an improved 3-level NPC inverter/rectifier which overcomes one or more of the above-mentioned issues, or at least provides an alternative solution, particularly for power applications such as EV and HEV traction inverters, photovoltaic grid inverters, and motor controllers.

A first aspect of the invention provides a switching device comprising an active multi-level neutral point clamped (NPC) inverter/rectifier, wherein each phase leg comprises:
a high side switch and a low side switch connected in a half-bridge configuration between a first DC link terminal (+Vdc) and a second DC link terminal (-Vdc), and comprising an AC link terminal connected to an output node between the high side switch and the low side switch;
a neutral clamping leg comprising an active bidirectional switch comprising first and second switches connected between a DC link midpoint terminal and the output node; and
logic circuitry configured to enable/disable the neutral clamping leg responsive to a signal indicative of real-time load conditions, enabling the neutral clamping leg for operation in a 3-level mode below a specified threshold load, and disabling the neutral clamping leg for operation in a 2-level mode at or above the specified threshold load.

Another aspect of the invention provides a switching device comprising an active multi-level T-type neutral point clamped (NPC) inverter/rectifier, wherein each phase leg comprises:
a high side switch and a low side switch connected in a half-bridge configuration between a first DC link terminal (+Vdc) and a second DC link terminal (-Vdc), and an AC link terminal connected to an output node between the high side switch and the low side switch;
a neutral clamping leg comprising an active bidirectional switch comprising first and second switches connected between a DC link midpoint terminal (neutral/0V) and the output node; and
logic circuitry configured to enable/disable the neutral clamping leg responsive to a load signal indicative of real-time load conditions, enabling the neutral clamping leg for operation in a 3-level mode below a specified threshold load, and disabling the neutral clamping leg for operation in a 2-level mode at or above the specified threshold load.

Another aspect of the invention provides a system comprising an inverter/rectifier as defined above, wherein the DC link terminals are connected to a DC link supply and the AC link terminals are connected to a load, and wherein the means configured to enable/disable the neutral clamping leg comprises: load level detection means (load level detector) for generating a load signal indicative of real-time load conditions, enable/disable logic means (enable/disable logic circuitry) responsive to said load signal for outputting an enable/disable signal to a gate driver for switches S2 and S3 of the neutral clamping leg, and the gate driver being configured to enable/disable the neutral clamping leg responsive to the enable/disable signal, enabling the neutral clamping leg for operation of the inverter/rectifier in a first mode as a 3-level inverter/rectifier below a predetermined threshold load, and disabling the neutral clamping leg for operation of the inverter/rectifier in a second mode as a 2-level inverter/rectifier above the threshold load.

Yet another aspect of the invention provides a method of operating a system comprising a 3-level NPC inverter/rectifier, as defined above. comprising:
monitoring a real-time load condition and generating a load signal indicative of real-time load conditions;
providing the load signal to enable/disable logic means which provides an enable/disable signal to a gate driver for switches S2 and S3 of the neutral clamping leg;
operating the gate driver to enable/disable the neutral clamping leg responsive to the enable/disable signal, comprising:
enabling the neutral clamping leg for operation of the inverter/rectifier in a first mode as a 3-level inverter/rectifier below a predetermined threshold load, and
disabling the neutral clamping leg for operation of the inverter/rectifier in a second mode as a 2-level inverter/rectifier at or above the threshold load.

The means configured to enable/disable the neutral clamping leg operates as a mode selection means, or mode selector, to select first or second modes of operation, dependent on load conditions, to enable and disable neutral point clamping.

The power switches S1 and S4 of the inverter/rectifier have a current rating for operation at peak load, and switches S2 and S3 may have a lower current rating for operation below said predetermined threshold load.

All switches S1, S2, S3 and S4 may be implemented using GaN technology, SiC technology, or Si technology. Alternatively, hybrid implementations may be provided. For example, in in one embodiment, the high side and low side switches S1 and S4 comprise Si IGBTs and diodes, and the switches S2 and S3 of the neutral clamping leg comprise GaN HEMTs. This hybrid embodiment takes advantage of performance advantages of GaN technology for the switches of neutral clamping leg to enhance performance of the Si IGBT and diode main switches. This arrangement offers significantly improved overall device performance, at minimal incremental cost over a conventional 3-level T-type NPC inverter/rectifier topology implemented using all Si IGBTs and diodes.

In an inverter/rectifier comprising hybrid Si and GaN technologies, wherein, switches S1 and S4 comprise Si IGBTs, and S2 and S3 comprise GaN HEMTs, to take advantage of the faster switching speed of the GaN HEMTS, beneficially, the anti-parallel diodes of Si IGBT switches S1 and S4 comprise faster SiC Schottky barrier diodes instead of Si diodes.

In an inverter/rectifier of an embodiment comprising hybrid Si and GaN technologies, wherein S1 and S4 comprise Si IGBTs and slower Si diodes, and S2 and S3 comprises GaN HEMTs, operation of hybrid inverter for enhanced performance is feasible if the GaN HEMTs are operated at a lower switching speed. This option provides reduced efficiency, but lower cost.

The inverter/rectifier may be a 3-phase inverter/rectifier, for example a traction inverter for an EV or HEV. Since a vehicle traction inverter typically operates at high/peak load for only a small percentage of driving time, i.e. during acceleration, the neutral clamping leg may be enabled for operation of the inverter/rectifier as a 3-level inverter/rectifier when the predetermined threshold load is e.g. below 50%, for example ~30%. Thus, the mode selection means for enabling/disabling the neutral clamping leg of the inverter/rectifier, responsive to real-time load conditions, is configured to switch dynamically between operation in the second mode (2-level inverter) for driving conditions comprising acceleration and peak load, and operation in the second mode (3-level inverter) for other driving conditions and (3-level rectifier) for braking/regeneration.

Devices and systems comprising a 3-level NPC inverter/rectifier or a 3-Level T-Type NPC inverter/rectifier, and methods of their operation, are disclosed that seek to provide enhanced performance and/or lower cost, for power applications such as, vehicle traction inverters/rectifiers, grid inverters, motor controllers, et al.

The foregoing and other objects, features, aspects and advantages of the present invention will become more apparent from the following detailed description, taken in conjunction with the accompanying drawings, of preferred embodiments of the invention, which description is by way of example only.

DETAILED DESCRIPTION

A circuit schematic for a three phase 2-level inverter topology comprising Si IGBTs and Si anti-parallel diodes is shown in FIG. 1 (Prior Art). Each phase leg comprises a high side power switch S1 and a low side power switch S2. Each switch comprises a Si IGBT and an anti-parallel diode, which may be referred to as a free-wheeling diode (FWD). The anti-parallel diode may be a low-cost silicon diode, or a SiC Schottky barrier diode (SBD). Each switch must be capable of blocking the entire input voltage Vdc. For example, for an EV or HEV traction inverter of e.g. 50 kW to 80 kW, the operating voltage supplied from a battery bank may have a DC link voltage in the range of 750V to 900V. Thus, for this power application, 1200V Si IGBTs would typically be used for each power switch S1 and S2.

A circuit schematic for a three-phase T-type Neutral Point Clamped (NPC) 3-level inverter topology comprising Si IGBTs and anti-parallel diodes is shown in FIG. 2 (Prior Art). As for the 2-level topology shown in FIG. 1, each phase leg comprises a high side power switch S1 and a low side power switch S4. S1 and S4 may be referred to as the "outer switches", and each comprises a Si IGBT and an anti-parallel diode (T1, D1 and T4, D4). Additionally, a neutral clamping leg is provided which comprises a bidirectional switch to the Vdc midpoint, or neutral point. The bidirectional NPC switch comprising switches S2 and S3, which may be referred to as "middle switches", may be implemented with two anti-series Si IGBTs (T2, T3), connected in common emitter configuration, with anti-parallel diodes (D2, D3), as illustrated in FIG. 2. Alternatively, the two Si IGBTs may be in common collector configuration.

Figure 3:
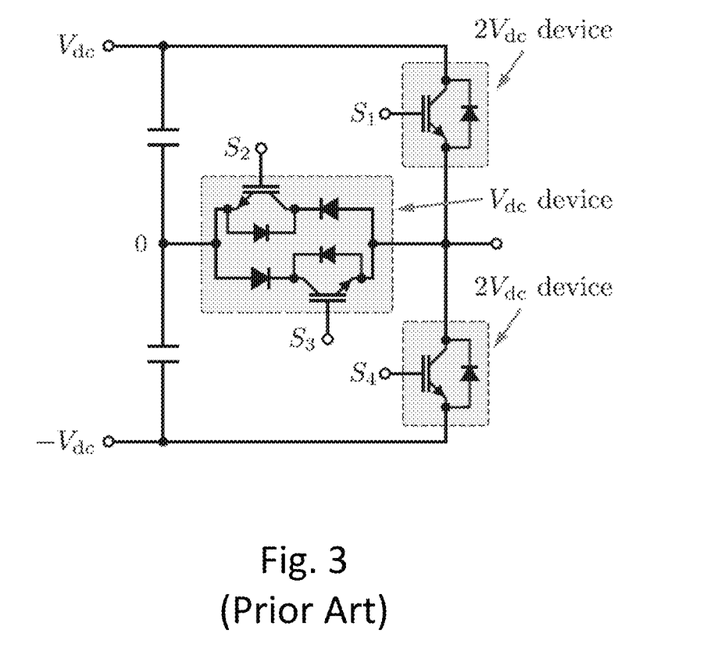
FIG. 3 (Prior Art) shows one phase leg of an active T-type NPC inverter comprising Si IGBTs and diodes.
Figure 4:
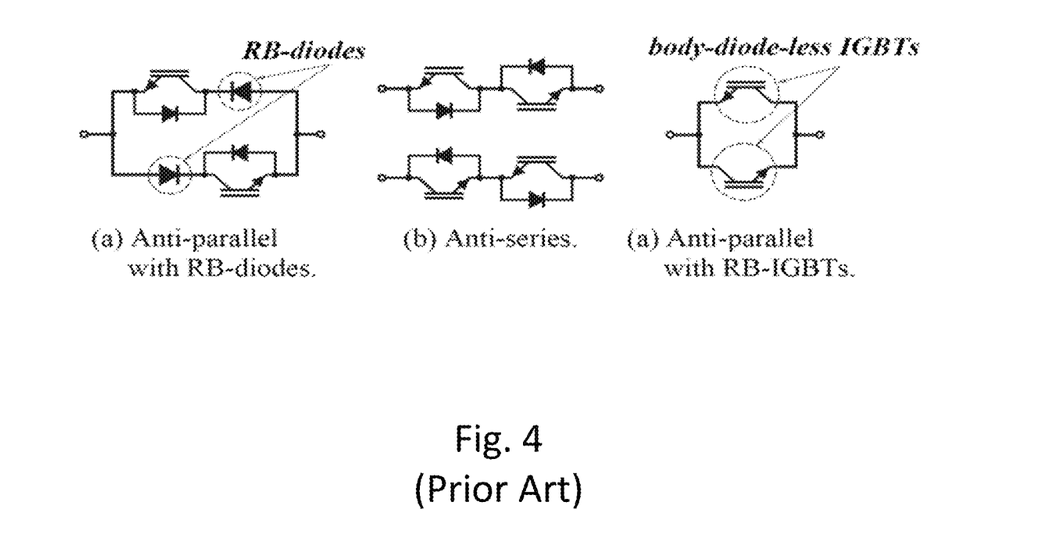
FIG. 4 (Prior Art) shows three options for implementing the bidirectional NPC switch of the T-type three-level inverter topology shown in FIG. 3.

As illustrated in FIG. 3, which shows one phase leg of an active T-type NPC inverter topology, for a DC link voltage between +Vdc and −Vdc, each of the outer switches, i.e. high side and low side switches S1 and S4, are 2 Vdc devices, e.g. 1200 V IGBTs, because each must be capable of blocking the DC link voltage of 2 Vdc. However, each of the inner switches S2 and S3 of the neutral clamping leg are Vdc devices, e.g. 600V IGBTs, because they are required to block only half the DC link voltage. Examples of implementations of the bidirectional switch of the neutral clamping leg of a 3-level T-type NPC inverter in are shown in FIG. 4 (Prior Art), i.e., (a) anti-parallel IGBT switches with reverse-blocking (RB) diodes (as shown in FIG. 3), (b) anti-series IGBT switches in common emitter or common collector configuration, and (c) anti-parallel switches with RB IGBTs.

Figure 5:
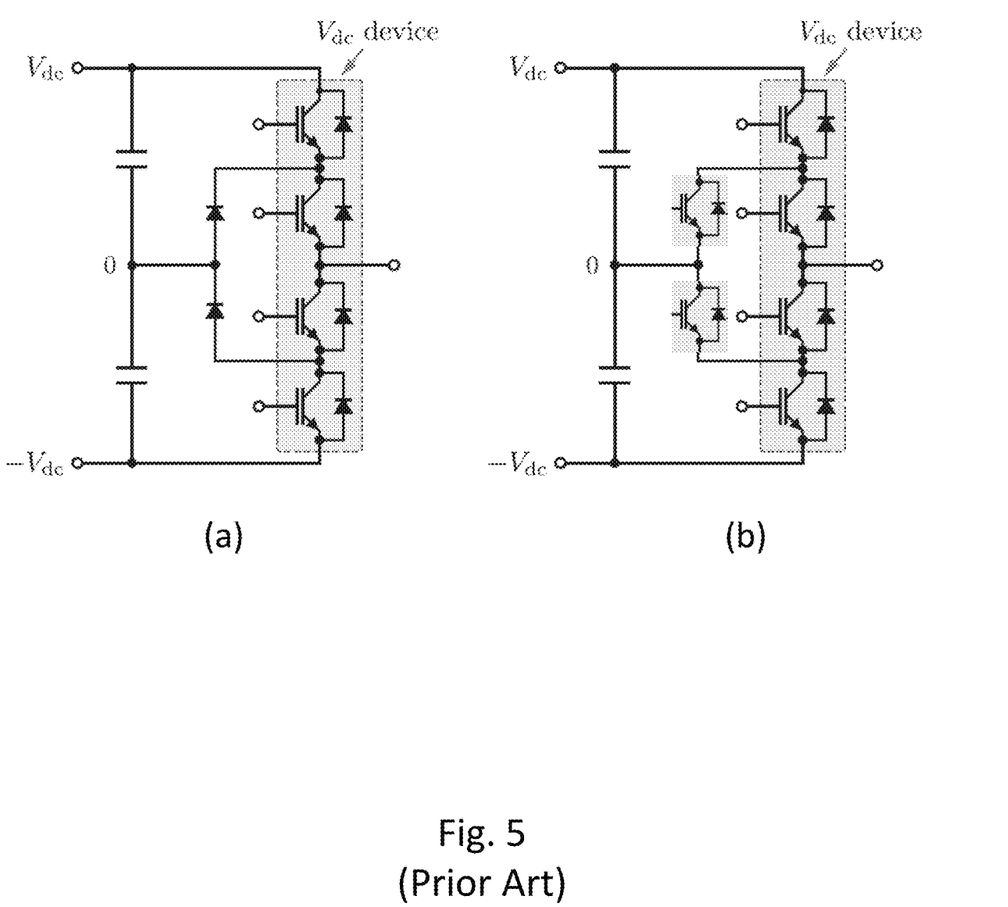
FIG. 5 (Prior Art) shows a) a diode clamped 3-level NPC inverter/rectifier topology; and b) an active 3-level NPC inverter/rectifier topology.

Circuit schematics are shown in FIG. 5 (Prior art) for one phase leg of each of (a) a conventional diode clamped 3-level NPC inverter topology using Si IGBTs and diodes, and (b) an active 3-level NPC inverter topology using Si IGBTs and diodes. For comparison with the 3-level T-type NPC topology shown in FIG. 3, in the diode clamped NPC inverter topology shown in FIG. 5 (a), each of the switching devices are Vdc devices, e.g. 600V Si IGBTs and diodes, because each device needs to block only half the DC link voltage. As shown in FIG. 5 (b), the two diodes used for the neutral point clamping as shown in FIG. 5 (a) are replaced by two transistor switches to provide an active 3-level NPC inverter topology.

Dual-Mode Hybrid 3-level T-Type NPC Inverter/Rectifier

Figure 6:
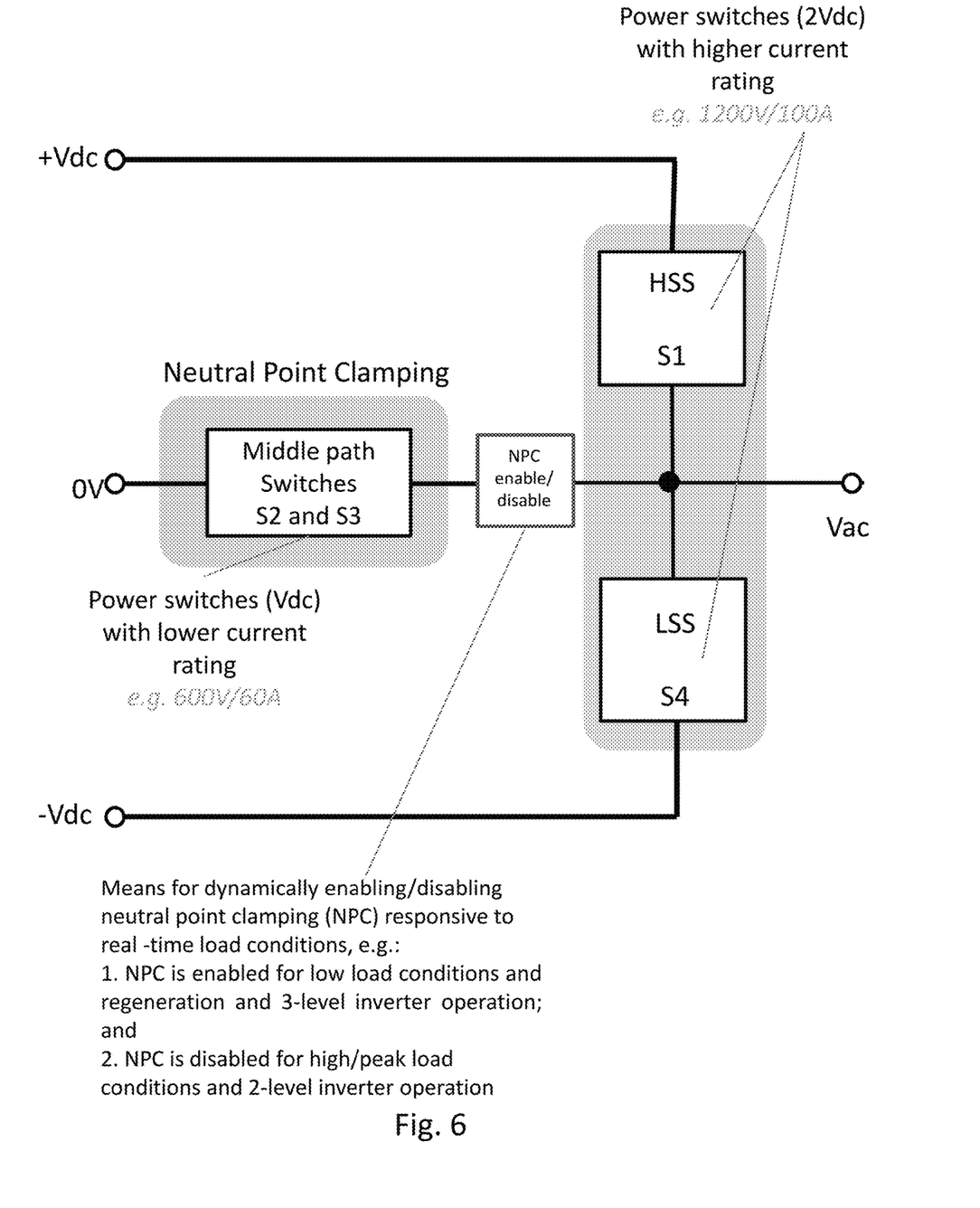
FIG. 6 shows a schematic block diagram of a 3-level T-type NPC inverter/rectifier topology of an embodiment which is dynamically switchable between two operational modes responsive to load conditions: 1) a first mode wherein the neutral clamping leg is enabled for 3-level inverter operation, e.g. at low loads; and 2) a second mode wherein the neutral clamping leg is disabled for 2-level inverter operation, e.g. at high/peak loads.

FIG. 6 shows a schematic block diagram representing one phase leg of a 3-level T-type NPC inverter topology of an embodiment wherein the outer switches, comprising a high side switch (HSS) S1 and low side switch (LSS) S4, are connected in a half bridge configuration between the DC link terminals, +Vdc and −Vdc. A neutral clamping leg comprising middle path switches S2 and S3 is connected between the neutral link terminal, 0 Vdc, and the output node N. The latter is connected to the AC link terminal Vac. Also, as represented schematically by the block labelled "NPC enable/disable", this topology comprises means for dynamically enabling/disabling the neutral point clamping (NPC) leg, responsive to instantaneous load conditions. That is, when the NPC leg is enabled, the inverter operates in a first operational mode, as a 3-level T-type inverter. When the NPC leg is disabled, the inverter operates in a second operational mode, as a 2-level inverter. For example, NPC is enabled for lower load operation and NPC is disabled for high/peak load operation. Thus, a dual-mode T-type NPC inverter/rectifier is provided, which is dynamically switchable, i.e. cycle by cycle, between 3-level and 2-level operation, responsive to load conditions. The high side and low side switches S1 and S4 (HSS and LSS) are rated for a blocking voltage of 2 Vdc and peak operational current, e.g. 1200V/100 A Si IGBTs, as in a 2-level inverter. Since S2 and S3 provide the neutral clamping leg of the 3-level T-type inverter, they would typically be rated for half the blocking voltage of S1 and S4, i.e. rated for Vdc, e.g. 600V. On the other hand, when the middle switches S2 and S3 of the NPC leg are to be enabled only for low load conditions, S2 and S3 may be implemented with smaller, lower cost devices. Thus, when S2 and S3 are enabled only for low load conditions, they may be rated for lower current than S1 and S4, e.g. 600V/60 A Si IGBTs.

In practical implementations of the dual-mode T-type NPC inverter/rectifier, the means for enabling/disabling the NPC leg comprises a feedback loop which monitors real-time load conditions and dynamically enables/disables the NPC leg responsive to the current load conditions, i.e. for selecting 3-level inverter or 2-level inverter operation.

While switches comprising Si IGBTs are referred to by way of example, this dual-mode T-type NPC inverter/rectifier topology may be implemented using any one of Si, SiC and GaN technologies. For some applications, the dual-mode T-type NPC inverter/rectifier may be implemented using hybrid technology.

The dual-mode operation will be described in more detail with reference to a system comprising a hybrid 3-level T-type NPC inverter of an embodiment shown in FIG. 7. Benefits of dual-mode operation of the 3-level T-type NPC inverter will be explained with reference to industrial applicability of the system to an EV traction inverter/rectifier.

Figure 7:
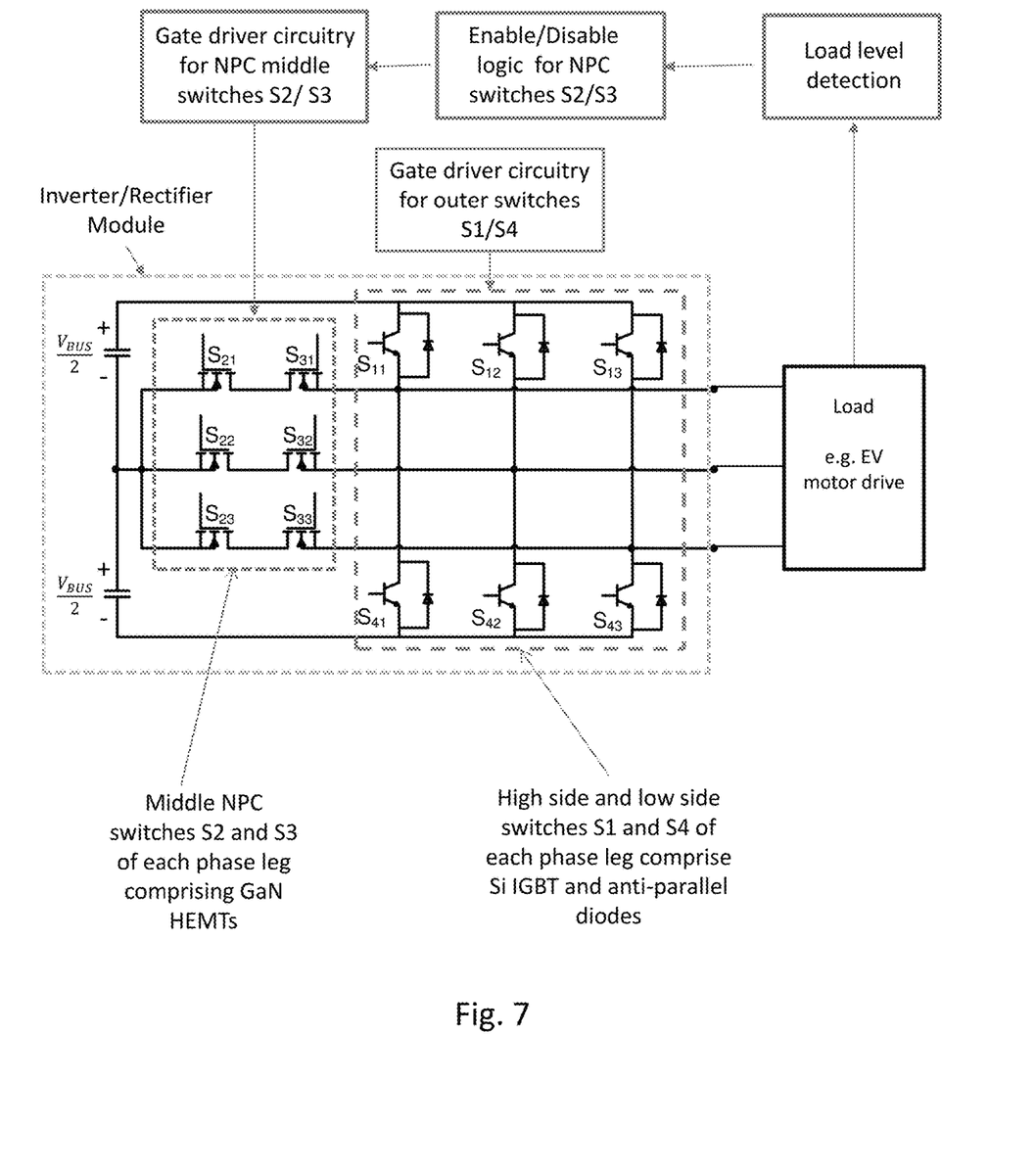
FIG. 7. shows a schematic diagram of system of an embodiment comprising a hybrid three-level T-type inverter/rectifier based on the topology shown in FIG. 6, implemented using Si IGBT outer switches (S1 and S4) with anti-parallel diodes, and GaN HEMT middle switches (S2 and S3) for the neutral clamping leg.

As illustrated schematically in FIG. 7, the system comprises a three-phase hybrid 3-level T-type NPC inverter/rectifier implemented as a hybrid inverter/rectifier module wherein the high side and low side outer switches, S1 and S4, of the 3-level T-type NPC inverter comprise Si IGBTs and diodes, and the middle switches, S2 and S3, of the neutral clamping leg comprise GaN HEMTs (back-to-back). The system comprises gate driver circuitry for the outer, main switches S1 and S4, comprising Si IGBTs and diodes, and gate driver circuitry for the middle switches of the NPC clamping leg, S2 and S3, comprising GaN HEMTs. The DC link terminals +Vdc and −Vdc are connected to the DC power supply, e.g. the vehicle battery if the inverter is an EV traction inverter. The AC link terminals of the inverter/rectifier are connected to the load, e.g. an EV motor drive.

Figure 8:
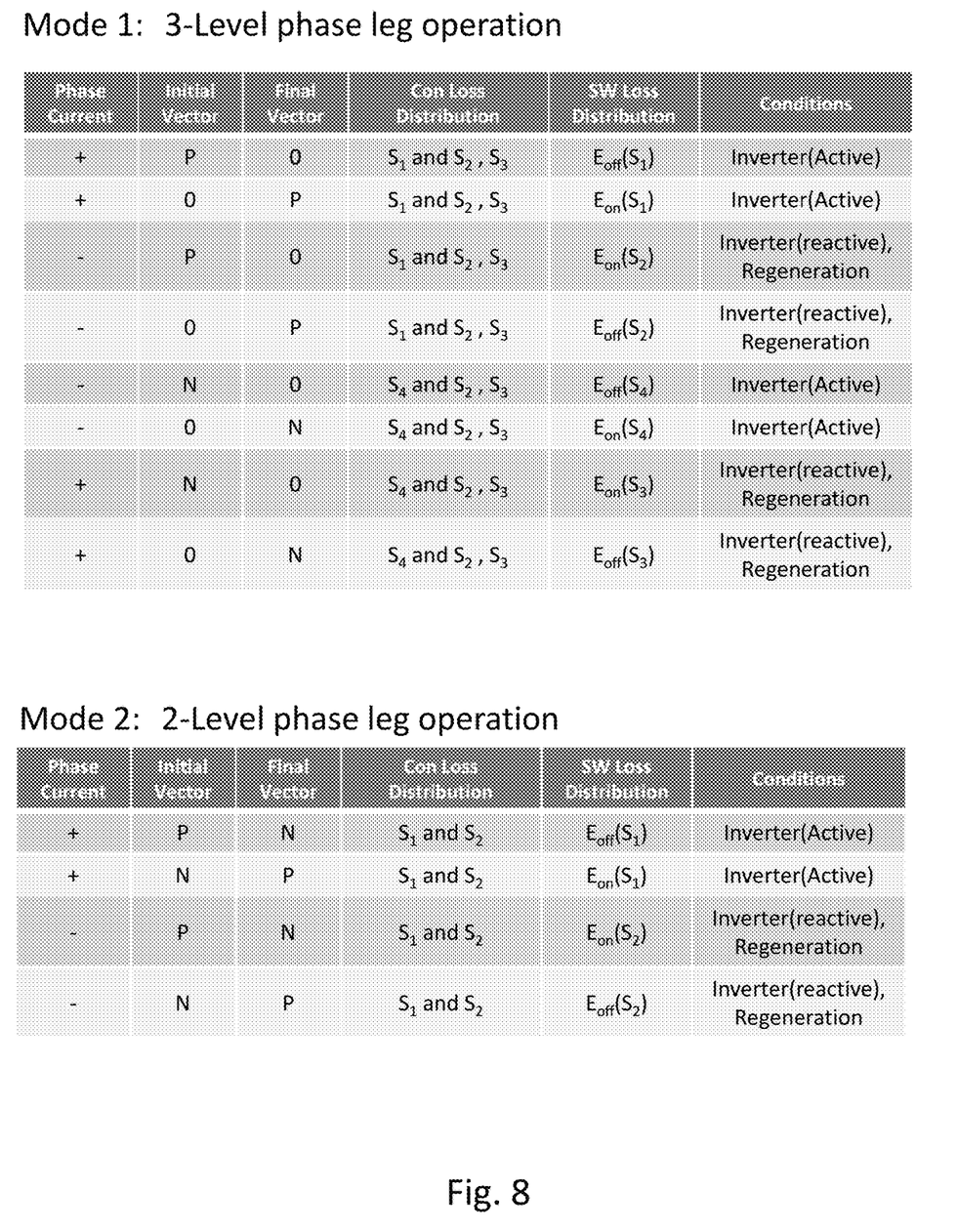
FIG. 8 shows a table of operational rules (switching states) of the dual-mode T-type NPC inverter/rectifier shown in FIG. 7, in a first mode with NPC enabled for 3-level inverter operation, and in a second mode with NPC disabled for 2-level inverter operation.

As represented schematically by the other blocks of the system, a feedback loop is provided including load detection means, e.g. a load level sensor, which provides a load feedback signal input to a logic means, e.g. a logic block comprising logic elements for determining whether a threshold load condition is met for enabling/disabling the neutral point clamping leg. For example, under low load, low current drive conditions, the NPC leg is enabled for 3-level NPC inverter operation and the gate driver circuitry for GaN HEMTs of the NPC leg and the gate driver circuitry for the main Si IGBTs operates as usual for 3-level T-type NPC inverter operation. That is, the respective gate driver circuits provide gate drive signals to the GaN HEMTs and to the Si IGBTs to implement switching states, as illustrated in FIG. 8 for the first mode of operation, where NPC is enabled for conventional 3-level T-type NPC inverter operation. When the load condition reaches a predetermined threshold load condition for switching to the second mode of operation, i.e. 2-level operation, the logic block outputs a signal to the driver circuitry for the GaN HEMTs module to disable the NPC leg, i.e. ensuring the GaN HEMTs are maintained in a disabled/OFF state as illustrated in FIG. 8 for the second mode of operation, where NPC is disabled. In the second mode of operation, when the NPC leg is disabled, i.e. by disabling the GaN HEMT sub-module or maintaining both GaN HEMTs in a non-conductive OFF state, so that the T-type NPC inverter in effect operates as a conventional 2-level inverter. When the detected load condition drops below the threshold for operation in the second mode as a 2-level inverter, NPC is again enabled for operation in the first mode as a 3-level inverter.

Utility of a dual-mode hybrid T-type NPC inverter/rectifier in which the NPC leg is selectively enabled/disabled responsive to load conditions, to allow the T-type inverter to operate in a first operational mode as a 3-level inverter and in a second operational mode as a 2-level inverter, will now be described, by way of example, with reference to data simulations for an EV traction inverter of an embodiment, based on $V_{BUS}$=800V, $V_{AC}$=400$V_{RMS}$, rated phase power of 50 kW, $I_{PEAK}$=~180 A, $I_{RMS}$=~125 A, and 10 kHz switching frequency. As an EV traction inverter is typically operating at less than 30% rated current for most of the time, this example is aimed at improving the efficiency for loads of ≤30%, i.e. a current of 37.5 $A_{RMS}$. This GaN hybrid solution comprises 1200V IGBTs and 650V GaN HEMTs, to combine the low conduction losses of IGBTs and the low switching losses of GaN HEMTs. This hybrid solution is found to be more cost effective than a SiC 2-level solution, and a D-type 3-level GaN solution. Compared to conventional 2-level inverters, system benefits may include higher power density, higher efficiency and lower switching losses, smaller DC link capacitor and output filters, and lower EMI and leakage current. The proposed hybrid T-type 3-level power module requires only one additional isolated DC/DC power supply and smaller passive components result in a lower BOM cost.

Figure 9:
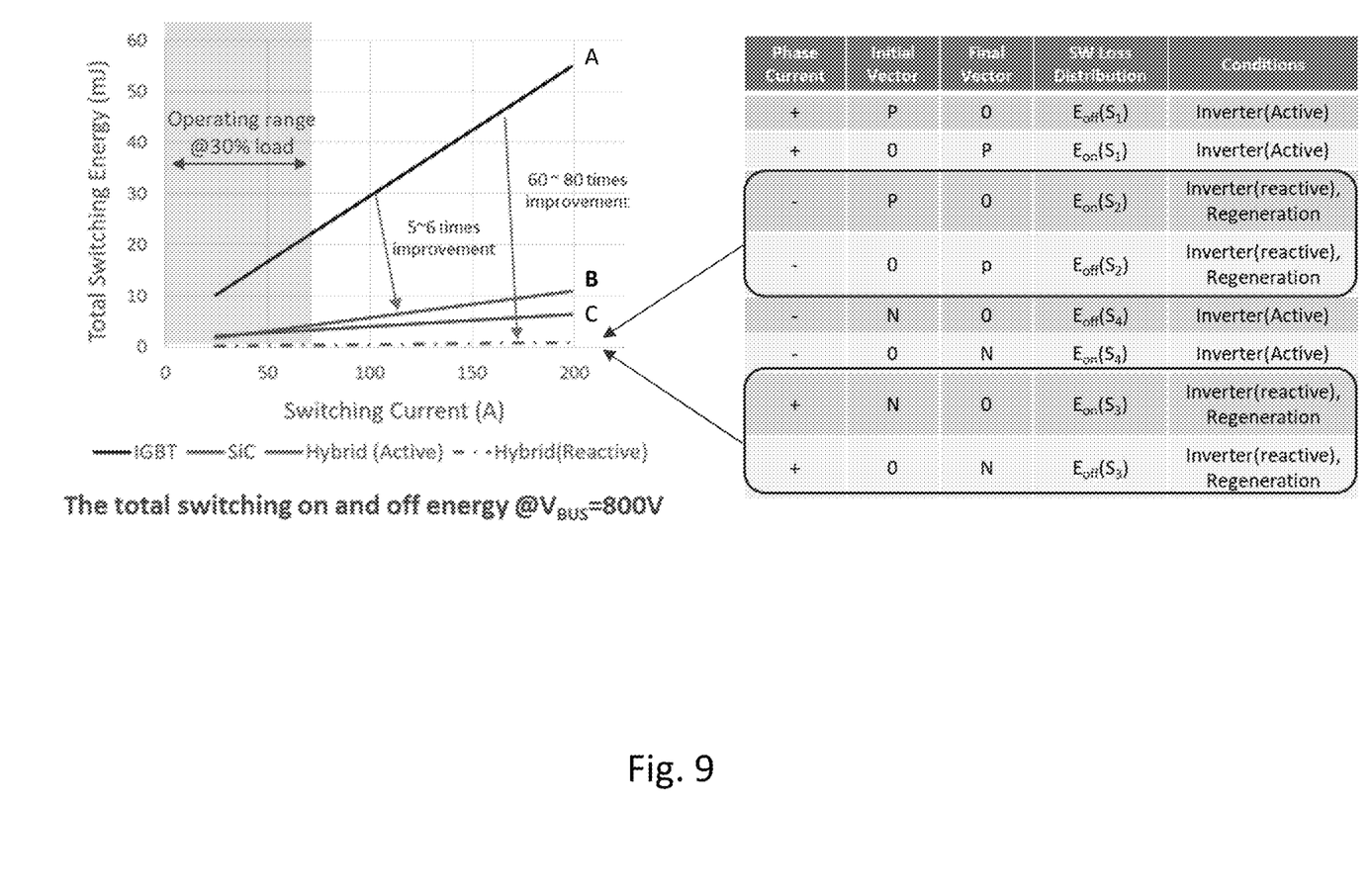
FIG. 9 shows a plot of switching current (A) vs. total switching energy (mJ) for a 3-level T-type NPC inverter (operating in 3-level mode) implemented using: A) all Si-IGBTs and diodes; B) all SiC MOSFETs and diodes; and C) a hybrid T-Type converter comprising Si IGBTs and diodes for outer switches S1 and S4, and GaN HEMTs (back-to-back) for NPC switches S2 and S3.
Figure 10:
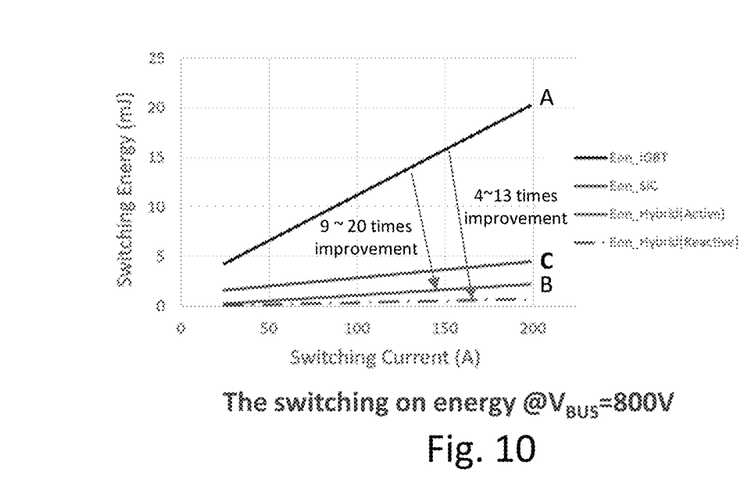
FIG. 10 shows plots of switching current (A) vs. switching energy (mJ), for switching on @$V_{BUS}$=800V, for a 3-level T-type NPC inverter (operating in 3-level mode) implemented using: A) all Si-IGBTs and diodes; B) all SiC MOSFETs and diodes; and C) a hybrid T-Type converter comprising Si IGBTs and diodes for outer switches S1 and S4, and GaN HEMTs (back-to-back) for NPC switches S2 and S3.
Figure 11:
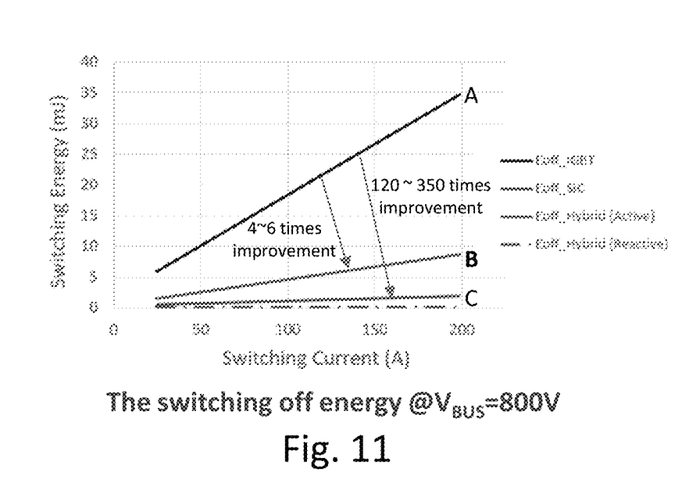
FIG. 11 shows plots of switching current (A) vs. switching energy (mJ), for switching off @$V_{BUS}$=800V, for a 3-level T-type NPC inverter (operating in 3-level mode) implemented using: A) all Si-IGBTs and diodes; B) all SiC MOSFETs and diodes; and C) a hybrid T-Type converter comprising Si IGBTs and diodes for outer switches S1 and S4, and GaN HEMTs (back-to-back) for NPC switches S2 and S3.
Figure 12:
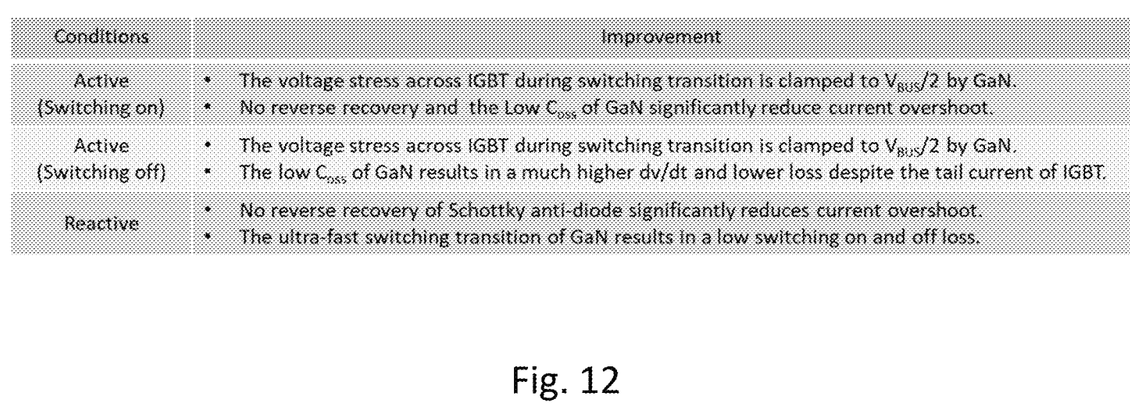
FIG. 12 shows a table of conditions and improvements.

FIG. 9 shows a plot of switching current (A) vs. total switching energy (mJ) for a 3-level T-type NPC inverter (operating in 3-level mode) implemented using: A) all Si-IGBTs and diodes; B) all SiC MOSFETs and diodes; and C) a hybrid T-Type converter comprising Si IGBTs and diodes for outer switches S1 and S4, and GaN HEMTs (back-to-back) for NPC switches S2 and S3. It is apparent that the hybrid T-Type converter provides about 5 to 6 times improvement, i.e. reduction in switching energy relative to the Si IGBT implementation, for active modes. For the highlighted reactive modes, as indicated by the dashed plot line, the hybrid solution provides about 60 to 80 times improvement over the IGBT implementation. The hybrid solution provides about 7 to 16 times improvement relative to SiC, for highlighted modes, and similar performance for other modes. FIGS. 10 and 11 shows corresponding plots of switching current (A) vs. switching on energy (mJ), and switching current vs. switching off energy (mJ), for the 3-level T-type NPC inverter (operating in 3-level mode) implemented using: A) all Si-IGBTs and diodes; B) all SiC MOSFETs and diodes; and C) a hybrid T-Type converter comprising Si IGBTs and diodes for outer switches S1 and S4, and GaN HEMTs (back-to-back) for NPC switches S2 and S3. The table in FIG. 12 provides a summary of conditions and improvements.

These data demonstrate that for the hybrid implementation, the absence of reverse recovery of the GaN HEMTs significantly reduces the switching losses of the Si IGBT in inverter mode. The ultra-fast transition of the GaN HEMT further reduces switching losses in rectifier mode. The hybrid implementation of the 3-level T-type NPC inverter topology combines the advantages of Si IGBTs, e.g. low cost and low conduction losses, with the advantages of low switching losses of GaN HEMTs. This hybrid implementation of 3-level T-type NPC inverter/rectifier topology is demonstrated to provide significant improvement in overall performance of an 800V traction inverter module.

Figure 13:
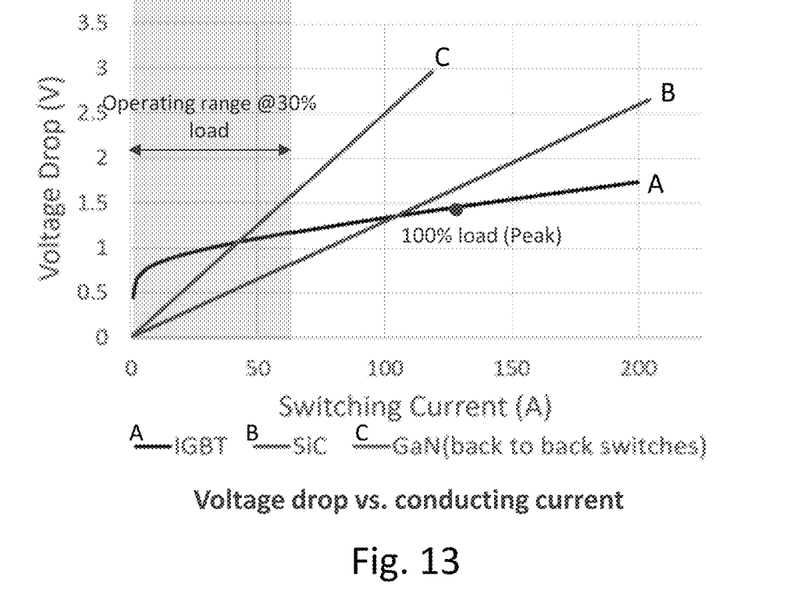
FIG. 13 shows a plot of switching current (A) vs. voltage drop (V) for a T-type three level inverter/rectifier (operating in 3-level mode) implemented using: A) all Si-IGBTs and diodes; B) all SiC MOSFETs and diodes; and C) a hybrid T-Type converter comprising Si IGBTs and diodes for outer switches S1 and S4, and GaN HEMTs (back-to-back) for NPC switches S2 and S3.

FIG. 13 shows of switching current (A) vs. voltage drop (V) for a T-type three level inverter/rectifier (operating in 3-level mode) implemented using: A) all Si-IGBTs and diodes; B) all SiC MOSFETs and diodes; and C) a hybrid T-Type converter comprising Si IGBTs and diodes for outer switches S1 and S4, and GaN HEMTs (back-to-back) for NPC switches S2 and S3. In most of the operating range of less than 30% load, GaN back-to-back switch contributes less conduction loss than IGBT. In Peak mode, the GaN back-to-back switch is disabled. A larger IGBT module could be employed to further reduce conduction losses, because of the low price of IGBT modules.

It will also be noted from the data shown in FIGS. 9, 10, 11, 12 and 13, that GaN HEMTs enhance the efficiency for low load conditions, where traction inverters operate during most of the time, when switching losses are more dominant. For example, EV traction inverters may operate at peak loads only ~5% of the time, e.g. during acceleration. If operation of the neutral clamping leg of the inverter/rectifier is restricted to low load operation only, e.g. below 30% load ratio, i.e. for low current operation below 60 A (see shaded region of FIG. 9 and FIG. 13), the GaN HEMTs can be of much lower current rating that the Si IGBTs, which may require e.g. 100 A or 150 A rating.

Figure 14:
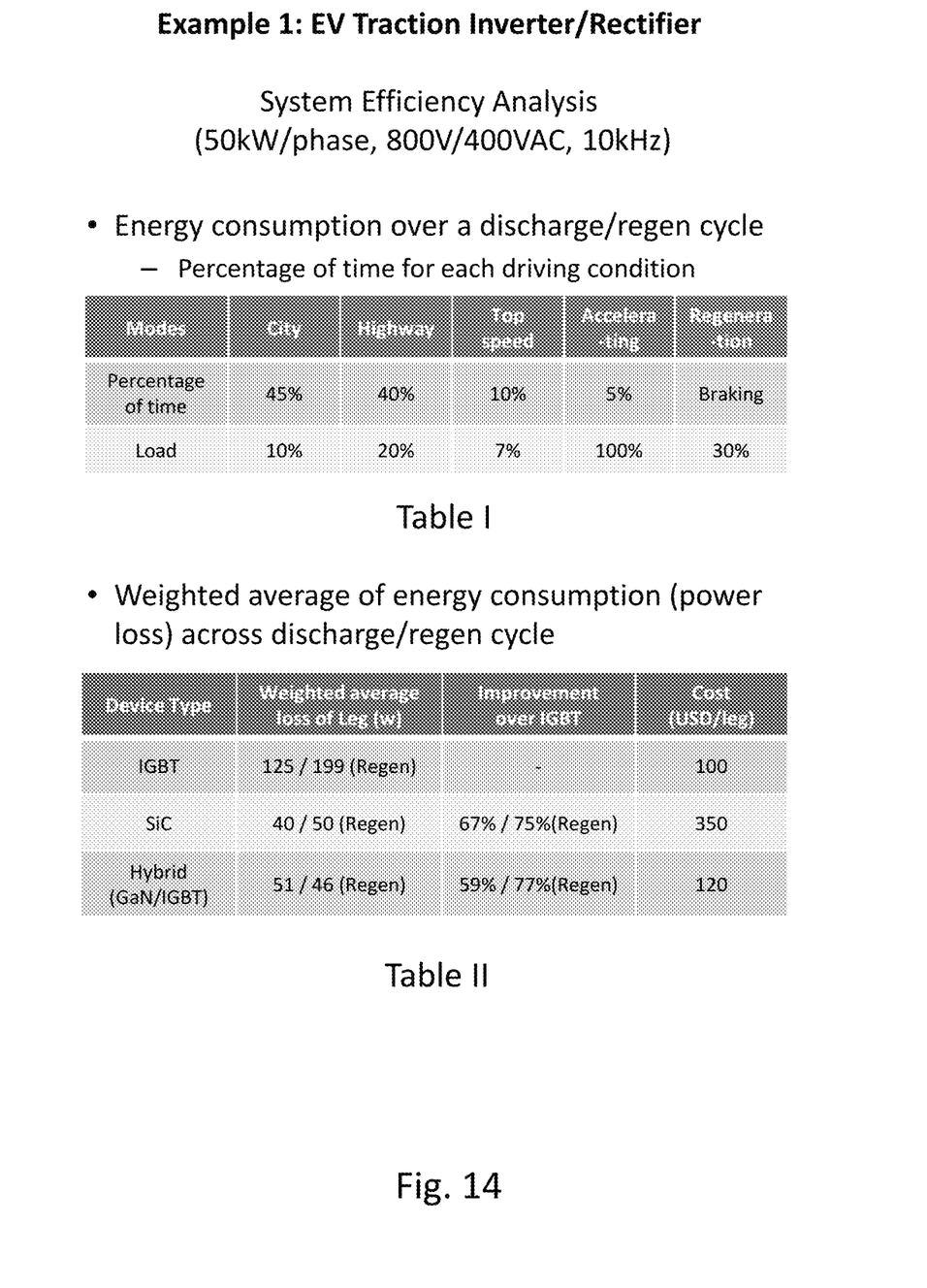
FIG. 14 shows data relating to system efficiency for an example of a 3-level T-type NPC inverter/rectifier for an EV traction drive (50 kW/phase, 800V/400 VAC, 10 kHz), comprising energy consumption over a discharge/regeneration cycle for different driving conditions (Table I) and weighted average of energy consumption (power loss) across a discharge/regeneration cycle (Table II) for T-type NPC inverters implemented using: all Si-IGBTs and diodes; all SiC MOSFETs and diodes; and the Si IGBT/GaN hybrid T-Type converter. comprising Si IGBTs and diodes for outer switches S1 and S4 and GaN HEMTs (back-to-back) for NPC switches S2 and S3.

FIG. 14 provides some example simulation data relating to system efficiency for the example of a 3-level T-type NPC inverter/rectifier for an EV traction drive (50 kW/phase, 800V/400 VAC, 10 kHz), comprising energy consumption over a discharge/regeneration cycle for different driving conditions (Table I) and weighted average of energy consumption (power loss) across a discharge/regeneration cycle (Table II) for T-type NPC inverters implemented using: all Si-IGBTs and diodes; all SiC MOSFETs and diodes; and a Si IGBT/GaN hybrid T-Type converter. comprising Si IGBTs and diodes for outer switches S1 and S4 and GaN HEMTs (back-to-back) for NPC switches S2 and S3. The data in Table I illustrate that for most driving conditions, or an estimated 95% of driving time, the load ratio is well below 30%. The load ratio is estimated to be about 30% during braking and regeneration, i.e. when operating as a rectifier to deliver energy back to the vehicle's battery system. Thus, typically, peak load, i.e. 100% load ratio, such as for acceleration, is required for only a small percentage, e.g. ~5% of driving time. The data in Table II illustrate that the SiC implementation of the 3-level T-type NPC inverter/rectifier significantly reduces the weighted average loss per phase leg by about 67% for driving conditions and 75% for regeneration, but at a significant cost premium. Referring to the relative cost per phase leg shown in Table II in FIG. 14, while a SiC implementation of a 3-level T-type NPC inverter topology provides reduced power loss and performance improvement over a Si IGBT implementation, based on current pricing estimates, it is potentially three times the cost of a Si IGBT implementation of the 3-level T-type NPC inverter/rectifier. For the hybrid Si IGBT/GaN HEMT implementation of the 3-level T-type NPC inverter/rectifier, weighted average reduction in energy loss relative to the Si IGBT is comparable to the SiC implementation (i.e. a few % less for driving, and a few % more for regeneration). The hybrid Si IGBT/GaN HEMT implementation significantly reduces power loss with a minor cost premium, e.g. estimated at about 20% over an all Si IGBT implementation, based on current pricing.

Figure 15:
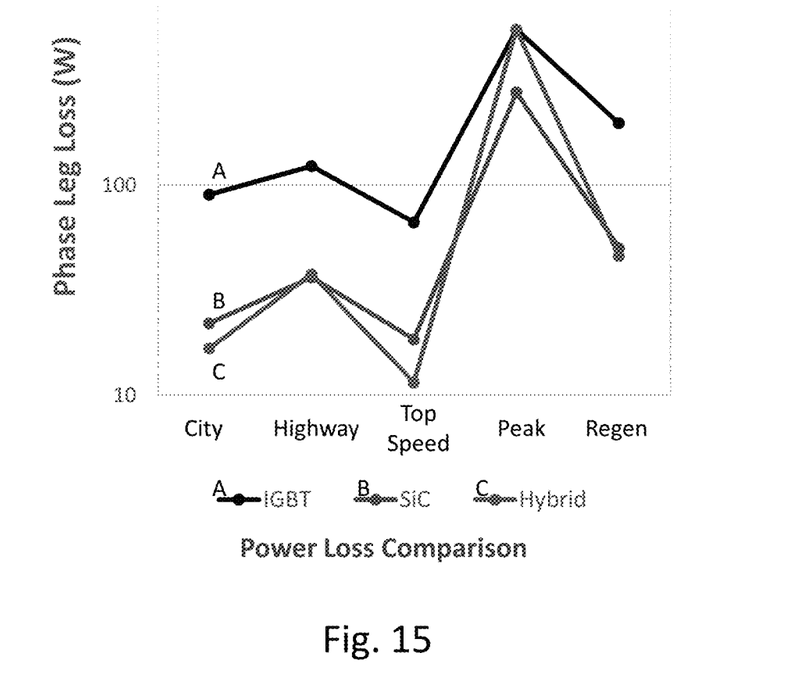
FIG. 15 shows a graphical representation of power loss for each phase leg (Watts) for driving conditions with different load ratios, i.e. City (10%); Highway (20%); Top Speed (7%); Peak/Acceleration (100%) and Regeneration/Braking (30%) for each of the Si IGBT, SiC MOSFET and Hybrid (Si IGBT/GaN HEMT) implementations of the 3-level T-type NPC inverter.
Figure 16:
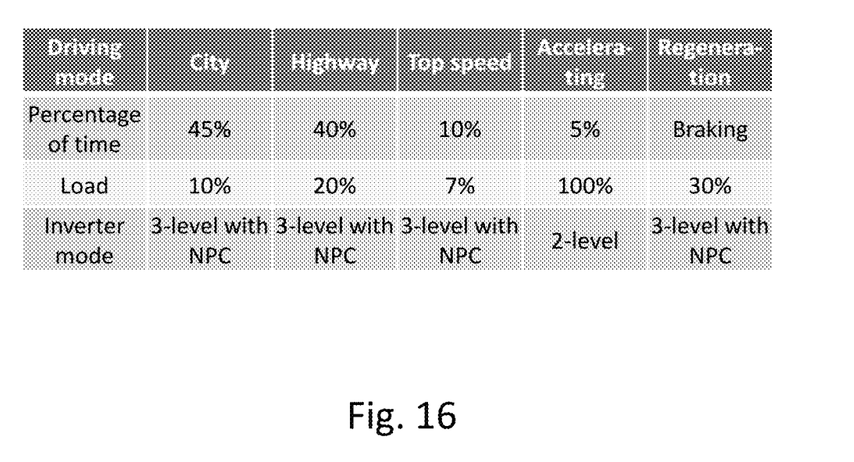
FIG. 16 shows a table illustrating an example of dual-mode operation of the T-Type NPC inverter: 1) in the first mode wherein the neutral clamping leg is enabled for 3-level inverter operation at low loads, e.g. for load ratios of ~30% or less, and for braking/regeneration; and 2) in the second mode wherein the neutral clamping leg is disabled for 2-level inverter operation at higher loads, e.g. at peak load during acceleration, and loads above a specific threshold.

FIG. 15 shows a graphical representation of power loss for each phase leg (Watts) for driving conditions with different load ratios, i.e. City (10%); Highway (20%); Top Speed (7%); Peak/Acceleration (100%) and Regeneration/Braking (30%) for each of the Si IGBT, SiC MOSFET and Hybrid (Si IGBT/GaN HEMT) implementations of the 3-level T-type NPC inverter. These data illustrate that the Hybrid implementation reduces power loss for all lower load driving conditions, other than peak load/acceleration. Correspondingly, FIG. 16 shows a table illustrating an example of dual-mode operation of the T-Type NPC inverter: 1) in the first mode wherein the neutral clamping leg is enabled for 3-level inverter operation at low loads, e.g. for load ratios of e.g. ~30% or less, and for braking/regeneration; and 2) in the second mode wherein the neutral clamping leg is disabled for 2-level inverter operation at higher loads, e.g. at peak load during acceleration, and loads above a specific threshold.

In a system comprising an active T-type three-level inverter based on that shown in FIG. 7, wherein the neutral clamping leg can be selectively and dynamically enabled and disabled, e.g. responsive to real-time load conditions, if this topology is implemented using all GaN, i.e. GaN HEMTS for both the main switches S1 and S4, and GaN bidirectional switches for the neutral clamping leg, since the neutral clamping leg can be implemented with lower cost GaN HEMTs of a lower current rating, reducing the overall cost of an all GaN solutions.

An all SiC implementation could similarly be configured with SiC MOSFETS of a lower current rating for the neutral clamping leg to reduce the cost of an all SiC solution. Other hybrid implementations are also contemplated wherein efficiency is optimized for different load ratios, e.g. by configuring the main power switches S1 and S4 for reduced conduction losses when the load is above a specific load ratio, and wherein the neutral clamping leg is configured to be enabled to reduce switching losses when the load is less than a specific load ratio.

In one example, data is presented herein to demonstrate that a hybrid implementation of a 3-level T-type inverter/topology, wherein S1 and S4 comprises Si IGBTs and diodes, and S2 and S3 comprise GaN HEMTs for S2 and S3 of the neutral switching leg can potentially provide enhanced performance at a small incremental cost over an all Si implementation. A practical implementation of an inverter/rectifier module may comprise a low-cost Si IGBT switching module for the high side and low side switches S1 and S4, in combination with a lower rated GaN HEMT switching module comprising S2 and S3 for the neutral clamping leg. For example, for application to traction inverters for electric vehicles, implementation of dual mode 3-level/2-level inverter/rectifier operation is achieved by monitoring load level signal received from a load detection sensor, logic elements to determine whether the detected load level signal is indicative of a load at or above a specified threshold load level, or below the threshold level, and controlling the gate driver for switches S2 and S3 of the neutral point clamping leg accordingly, to dynamically enable or disable the neutral point clamping leg responsive to real-time load conditions.

In an inverter/rectifier comprising hybrid Si and GaN technologies, wherein, switches S1 and S4 comprise Si IGBTs, and S2 and S3 comprise GaN HEMTs, to take advantage of the faster switching speed of the GaN HEMTS, beneficially, the anti-parallel diodes of Si IGBT switches S1 and S4 comprise are faster SiC Schottky barrier diodes instead of Si diodes.

In an inverter/rectifier of an embodiment comprising hybrid Si and GaN technologies, wherein S1 and S4 comprise Si IGBTs and slower Si diodes, and S2 and S3 comprises GaN HEMTs, operation of hybrid inverter for enhanced performance is feasible if the GaN HEMTs are operated at a lower switching speed.

Dual mode operation a 3-level T-type inverter/topology responsive to real-time load conditions, provides dynamic, cycle-by-cycle, switching between 3-level and 2-level modes of inverter/rectifier operation, as described herein, and enables smaller, lower cost components (i.e. lower voltage and lower current rating) to be used for S2 and S3, reducing overall system cost.

Although embodiments of the invention have been described and illustrated in detail, it is to be clearly understood that the same is by way of illustration and example only and not to be taken by way of limitation, the scope of the present invention being limited only by the appended claims.

For further information, reference is made to an article by the inventors, J. LU et al., entitled "A GaN/Si Hybrid T-Type Three-Level Configuration for Electric Vehicle Traction Inverter" October 2018 IEEE 6th Workshop on Wide Bandgap Power Devices and Applications (WiPDA), which is incorporated by reference in its entirety.

The invention claimed is:

1. A device comprising an active multi-level neutral point clamped (NPC) inverter/rectifier, wherein each phase leg comprises:
 a high side switch and a low side switch connected in a
  half-bridge configuration between a first DC link terminal and a second DC link terminal, and comprising an AC link terminal connected to an output node between the high side switch and the low side switch;

a neutral clamping leg comprising an active bidirectional switch comprising first and second switches connected between a DC link midpoint terminal and the output node; and logic circuitry configured to enable/disable the neutral clamping leg responsive to a signal indicative of real-time load conditions, enabling the neutral clamping leg for operation in a 3-level mode below a specified threshold load, and disabling the neutral clamping leg for operation in a 2-level mode at or above the specified threshold load.

2. A device comprising an active multi-level T-type neutral point clamped (NPC) inverter/rectifier, wherein each phase leg comprises:

a high side switch and a low side switch connected in a half-bridge configuration between a first DC link terminal and a second DC link terminal, and an AC link terminal connected to an output node between the high side switch and the low side switch;

a neutral clamping leg comprising an active bidirectional switch comprising first and second switches connected between a DC link midpoint terminal and the output node; and logic circuitry configured to enable/disable the neutral clamping leg responsive to a load signal indicative of real-time load conditions, enabling the neutral clamping leg for operation in a 3-level mode below a specified threshold load, and disabling the neutral clamping leg for operation in a 2-level mode at or above the specified threshold load.

3. The device of claim 2, wherein the high side switch and the low side switch have a current rating for operation at peak load, and the first and second switches of the neutral clamping leg have a lower current rating for operation below said specified threshold load.

4. The device of claim 2, wherein the high side switch, the low side switch, and the first and second switches of the neutral clamping leg are implemented using GaN technology.

5. The device of claim 2, wherein the high side switch, the low side switch, and the first and second switches of the neutral clamping leg are implemented using SiC technology.

6. The device of claim 2, wherein the high side switch, the low side switch, and the first and second switches of the neutral clamping leg are implemented using Si IGBTs and diodes.

7. The device of claim 2, wherein the high side switch and the low side switch comprise Si IGBTs and diodes and the first and second switches of the neutral clamping leg comprise GaN HEMTs.

8. The device of claim 2, wherein the high side switch and the low side switch comprise Si IGBTs and SiC Schottky barrier diodes and the first and second switches of the neutral clamping leg comprise GaN HEMTs.

9. The device of claim 2, having a 3-phase topology.

10. The device of claim 9, configured as a traction inverter for an electric vehicle, wherein the specified threshold load is less than 50%.

11. The device of claim 9, configured as a traction inverter for an electric vehicle, wherein the specified threshold load is approximately 30%.

12. The device of claim 9, configured as a traction inverter for an electric vehicle to operate in the 2-level mode for driving conditions comprising acceleration and peak load, and to operate in the 3-level mode for other driving conditions at lower loads and for braking/regeneration.

13. A system comprising an inverter/rectifier as defined claim 2, wherein the DC link terminals are connected to a DC link supply and the AC link terminals are connected to a load, and wherein the logic circuitry configured to enable/disable the neutral clamping leg comprises:

a load level sensor for generating a load signal indicative of real-time load conditions;

enable/disable logic circuitry configured to receive said load signal, and responsive to said load signal, to output an enable/disable signal to a gate driver for the first and second switches of the neutral clamping leg, and the gate driver for the first and second switches of the neutral clamping leg being configured to dynamically enable/disable the neutral clamping leg responsive to the enable/disable signal, enabling the neutral clamping leg for operation in the 3-level mode below the specified threshold load, and disabling the neutral clamping leg for operation in the 2-level mode at or above the specified threshold load.

14. A method of operating a system comprising a multi-level NPC inverter/rectifier, as defined in claim 13, comprising:

monitoring a real-time load condition and generating a load signal indicative of real-time load conditions;

providing the load signal to the enable/disable logic circuitry which provides an enable/disable signal to the gate driver for the first and second switches of the neutral clamping leg;

operating the gate driver to enable/disable the neutral clamping leg responsive to the enable/disable signal, comprising:

enabling the neutral clamping leg for operation in the 3-level mode below a specified threshold load, and disabling the neutral clamping leg for operation in the 2-level mode at or above the specified threshold load.

* * * * *